United States Patent
Iannotti et al.

(10) Patent No.: US 8,749,237 B2
(45) Date of Patent: Jun. 10, 2014

(54) OPTICALLY CONTROLLED MEMS SWITCH AND METHOD OF USING THE SAME

(75) Inventors: Joseph Alfred Iannotti, Niskayuna, NY (US); Eric Fiveland, Niskayuna, NY (US); William Platt, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 673 days.

(21) Appl. No.: 13/004,757

(22) Filed: Jan. 11, 2011

(65) Prior Publication Data
US 2012/0176135 A1 Jul. 12, 2012

(51) Int. Cl.
*G01V 3/00* (2006.01)
(52) U.S. Cl.
USPC ............................................. 324/322; 324/318
(58) Field of Classification Search
USPC ........................... 324/322, 318, 319, 309, 307
See application file for complete search history.

(56) References Cited

U.S. PATENT DOCUMENTS

| 5,869,966 | A  | * | 2/1999  | Gatehouse ............... 324/322 |
| 6,144,205 | A  | * | 11/2000 | Souza et al. ............. 324/322 |
| 6,710,597 | B2 |   | 3/2004  | Reykowski et al. |
| 7,388,186 | B2 |   | 6/2008  | Berg et al. |
| 7,538,554 | B2 | * | 5/2009  | Wendt et al. ............ 324/322 |
| 7,602,187 | B2 | * | 10/2009 | Luedeke et al. ......... 324/318 |
| 2010/0237227 | A1 |   | 9/2010  | Koste et al. |

* cited by examiner

*Primary Examiner* — Louis Arana
(74) *Attorney, Agent, or Firm* — Melissa K. Dobson

(57) ABSTRACT

The present embodiments are directed towards the optical control of switching an electrical assembly. For example, in an embodiment, an electrical package is provided. The electrical package generally includes a micro electromechanical systems (MEMS) device configured to interface with an electrical assembly, the MEMS device being operable to vary the electrical assembly between a first electrical state and a second electrical state, a MEMS device driver in communication with the MEMS device and being operable to produce high voltage switching logic from an electrical signal, and an optical detector in communication with the MEMS device driver and configured to produce the electrical signal from an optical signal produced by a light source in response to an applied current-based electrical control signal.

9 Claims, 6 Drawing Sheets

OPTICALLY CONTROLLED MEMS SWITCH AND METHOD OF USING THE SAME

BACKGROUND

The subject matter disclosed herein relates to switching devices using optical input, and more specifically to hardening the mechanical motion of a micro electromechanical systems (MEMS) device from electromagnetic interference.

Electronic switches are typically employed for the purpose of varying an electrical circuit between conducting states. Some switches, especially those with high impedance drive circuits, can be inadvertently activated with electro magnetic (EM) interference. For example, EM interference can couple onto switch drive logic connections, which are typically high input impedance circuits, and cause spurious switching logic transients. The switching logic transients, in turn, cause unintended switch activation. Some approaches to avoid the production of spurious switching logic transients include filtering the switch drive logic lines to mitigate EM interference coupling using L-C or R-C networks. However, some switches, such as micro electromechanical system (MEMS)-based switches, may operate at high frequencies such that conventional filtering technologies may not be able to operate at sufficient rates to be useful in MEMS applications. One example of such a system in which a switch may experience EM interference is a magnetic resonance imaging (MRI) system.

In MRI systems, a highly uniform, static magnetic field is produced by a primary magnet to align the spins of gyromagnetic nuclei within a subject of interest (e.g., hydrogen in water/fats). The nuclear spins are perturbed by a radiofrequency (RF) transmit pulse, encoded based on their position using gradient coils, and allowed to equilibrate. During equilibration, faint RF fields are emitted by the spinning, processing nuclei and are detected by a series of RF coils. The signals resulting from the detection of the RF fields are then processed to reconstruct a useful image.

The MRI system may include features to prevent damage to certain of the RF coils, such as those that receive faint RF signals from within a patient, while the RF transmit pulse and/or gradient pulses are being performed. Typically, blocking signals are provided to the receiving coils to prevent resonance with the RF transmit and gradient pulses, which can result in eddy currents, heat production, image artifacts, and potential damage to various electrical components. However, as noted above, some high impedance drive circuits employed in conjunction with switches that allow the blocking signals to be provided to the coils can experience spurious switching logic transients. The transients may result in the receiving coil being converted to a resonant state, which can be undesirable during certain phases of operation of the MRI system. Accordingly, a need exists for improved EM-hardened techniques for switching electrical circuits, such as those present in MRI systems.

BRIEF DESCRIPTION

In one embodiment, a magnetic resonance imaging (MRI) system is provided. The system generally includes a transmitting coil configured to transmit RF energy into a subject of interest, a receiving coil capable of being switched between at least a first state, in which the receiving coil can resonate in response to RF signals generated within the subject of interest, and a second state, in which the receiving coil is unable to resonate in response to RF energy produced by the transmitting coil, a switch configured to vary the receiving coil between the first and second states in response to a logic signal, a device driver configured to produce the logic signal in response to an electrical signal, and an opto-isolator configured to produce the electrical signal in response to a current-based control signal.

In another embodiment, a single electrical package is provided. The electrical package generally includes a micro electromechanical systems (MEMS) device configured to interface with an electrical assembly, the MEMS device being operable to vary the electrical assembly between a first electrical state and a second electrical state, a MEMS device driver in communication with the MEMS device and being operable to produce high voltage switching logic from an electrical signal, and an optical detector in communication with the MEMS device driver and configured to produce the electrical signal from an optical signal produced by a light source in response to an applied current-based electrical control signal.

In a further embodiment, a method for switching an electrical assembly is provided. The method includes converting a current-based control signal into an optical signal using a light source, converting the optical signal into an electrical signal using a light detector, converting the electrical signal generated by the light detector into switching logic, said switching logic generated by a device driver, converting the switching logic into mechanical motion to switch the electrical assembly between a first conductive state and a second conductive state using a micro electromechanical systems (MEMS) device.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
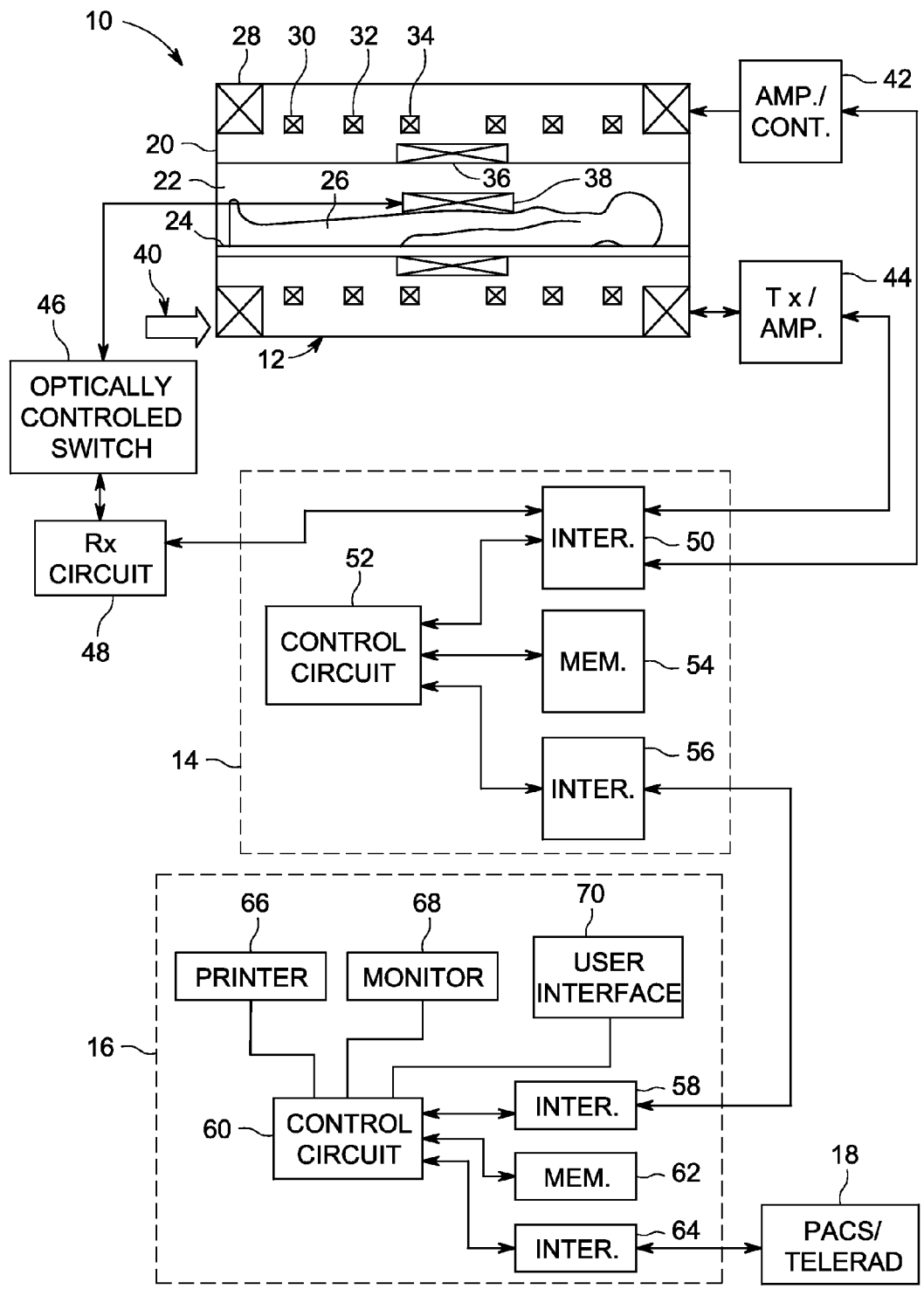
FIG. 1 is an illustration of an embodiment of a MRI system utilizing one or more receiving coils having an optically controlled MEMS device.

The approaches embodied herein overcome the shortcomings mentioned above, among others, by providing embodiments directed towards the optical control of switching in electrical assemblies. For example, it may be desirable to integrate a device capable of creating a physical disconnect into an electrical circuit, such as a resonant coil within an MRI system, so as to vary the electrical circuit between conductive states (i.e., between resonant and non-resonant states). Due to their high frequency of operation, MEMS devices can provide an attractive approach for creating such physical disconnects. For example, typical MEMS devices operate at frequencies such as between about 1 and 10 microseconds per switching event. Unfortunately, typical filtering approaches aimed towards mitigating EM interference with logic-carrying electrical features (i.e., logic connections) do not operate at sufficient speeds to allow their combination with MEMS devices. As an example, the timeframe of such filtering approaches can range anywhere from about 100 microseconds up to a millisecond, or more than an order of magnitude higher than the operation of the MEMS device.

In accordance with presently contemplated embodiments, in lieu of, or in addition to, performing such filtering operations, a MEMS device may be switched using a current-signaling based opto-isolator capable of electrically isolating the MEMS device, and the driver that provides the switching logic to the MEMS device, from control circuitry that controls the operation of the MEMS device. Indeed, as used herein, the term "opto-isolator" refers to a feature capable of transferring electrical signals via one or more optical signals. Thus, the opto-isolator provides coupling of an electrical source and an electrical output, such as a control signal source and a switch, while providing electrical isolation therebetween. In this way, the opto-isolator may also be referred to as an optocoupler, a photocoupler, or an optical isolator. In the present context, such isolation may provide enhanced prevention of electromagnetic interference (EMI).

It should be noted that by providing current-based control signals as opposed to voltage-based control signals, a light source within the opto-isolator will not be activated in response to EM energy produced during transmit sequences performed by the MRI system. In this way, spurious switching of the MEMS device, and thus the electrical assembly, can be avoided. More specifically, in an embodiment, a control circuit may provide a current control signal to operate an opto-isolator. The opto-isolator, during operation, produces an EM-immune beam of light that is converted into an electrical signal. A MEMS switch driver may then convert this electrical signal into switching logic for the MEMS device. As noted above, this allows the control circuit to be electrically isolated from the MEMS switch driver and MEMS device. It should be appreciated that while the present disclosure is applicable to any number of electrical assemblies, such as field effect transistors (FETs) or other electrical arrays, and is not limited to any particular implementation, various aspects of the present approaches are presented in the context of magnetic resonance imaging (MRI) systems so as to provide meaningful examples of one possible implementation. Specifically, the embodiments described herein are directed towards an optically controlled and current-driven switch configured to vary a resonant loop between resonant states.

Accordingly, the implementations described herein may be performed by a magnetic resonance imaging (MRI) system, wherein specific imaging routines are initiated by a user (e.g., a radiologist). Further, the MRI system may perform data acquisition, data construction, and image synthesis. Accordingly, referring to FIG. 1, a magnetic resonance imaging system 10 is illustrated schematically as including a scanner 12, a scanner control circuit 14, and a system control circuitry 16. System 10 additionally includes remote access and storage systems or devices as picture archiving and communication systems (PACS) 18, or other devices such as teleradiology equipment so that data acquired by the system 10 may be accessed on- or off-site. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient 26. The selected anatomy may be imaged by a combination of patient positioning, selected excitation of certain gyromagnetic nuclei within the patient 26, and by using certain features for receiving data from the excited nuclei as they spin and precess, as described below.

Scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. When the patient 26 is placed within the scanner 12, the gyromagnetic nuclei equilibrate their magnetization by generally aligning their spins perpendicular to the field of the primary magnet coil 28. A series of gradient coils 30, 32, and 34 permit controlled magnetic gradient fields to be generated for positional encoding of certain of the gyromagnetic nuclei during examination sequences. A radio frequency (RF) coil 36 is provided for generating radio frequency pulses for exciting the certain gyromagnetic nuclei within the patient. In addition to the coils that may be localized to and/or within the scanner 12, the system 10 also includes a set of receiving coils 38 configured for placement proximal to the patient 26. As an example, the receiving coils 38 can include cervical/thoracic/lumbar (CTL) coils, head coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to alignment with the field generated by the primary coil magnet 28. In accordance with present embodiments, the receiving coils 38 may be switched off so as not to receive or resonate with the transmit pulses generated by the scanner coils, and may be switched on so as to receive or resonate with the RF signals generated by the relaxing gyromagnetic nuclei.

The various coils of system 10 are controlled by external circuitry to generate the desired field and pulses, and to read emissions from the gyromagnetic material in a controlled manner. That is, in some embodiments, the circuitry may be disposed at a distance away from scanner 12 so as to avoid any interference resulting from the transmitted RF pulses and/or the bulk magnetic field. Such a distance may include having the circuitry in a separate room, at a separate facility, and so on. In the illustrated embodiment, a main power supply 40 provides power to the primary field coil 28. A driver circuit 42 is provided for pulsing the gradient field coils 30, 32, and 34. Such a circuit typically includes amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. In accordance with the present approaches, the receiving coils 38 are connected to an optically controlled switch 46 that is capable of switching the receiving coils 38 between receiving and non-receiving modes. That is, in some embodiments the optically controlled switch 46 varies the receiving coils 38 between conductive states, such that the receiving coils 38 resonate with the RF signals produced by relaxing gyromagnetic nuclei from within the patient 26 while in the receiving state, and they do not resonate with RF energy from the transmitting coils (i.e., coil 36) so as to prevent undesirable operation while in the non-receiving state. The optically controlled switch 46 can include a light source, a light detector, and a switch operatively connected to the light detector, for example via a driver. In one presently contemplated embodiment, the optically controlled switch 46 may be a single surface mount (SMT) package that is configured for integration with the receiving coils 38 (i.e., via a retrofit operation). Additionally, a receiving circuit 48 is provided for receiving the data detected by the receiving coils 38, and may include one or more multiplexing and/or amplification circuits. The configuration of the optically controlled switch 46 and its interface with the receiving coils 38 is described in further detail below.

Scanner control circuit 14 includes an interface circuit 50 for outputting signals for driving the gradient field coils 30, 32, 34 and the RF coil 36. Additionally, interface circuit 50 receives the data representative of the magnetic resonance signals produced in examination sequences from the receiving circuitry 48 and/or the receiving coils 38. The interface circuit 50 is operatively connected to a control circuit 52. The control circuit 52 executes the commands for driving the circuit 42 and circuit 44 based on defined protocols selected via system control circuit 16. Control circuit 52 also serves to provide timing signals to the optically driven switch 46 so as to synchronize the transmission and reception of RF energy. Further, control circuit 52 receives the magnetic resonance signals and may perform subsequent processing before transmitting the data to system control circuit 16. Scanner control circuit 14 also includes one or more memory circuits 54, which store configuration parameters, pulse sequence descriptions, examination results, and so forth, during operation. Interface circuit 56 is coupled to the control circuit 52 for exchanging data between scanner control circuit 14 and system control circuit 16. Such data will typically include selection of specific examination sequences to be performed, configuration parameters of these sequences, and acquired data, which may be transmitted in raw or processed form from scanner control circuit 14 for subsequent processing, storage, transmission and display.

An interface circuit 58 of the system control circuit 16 receives data from the scanner control circuit 14 and transmits data and commands back to the scanner control circuit 14. The interface circuit 58 is coupled to a control circuit 60, which may include one or more processing circuits in a multi-purpose or application specific computer or workstation. Control circuit 60 is coupled to a memory circuit 62, which stores programming code for operation of the MRI system 10 and, in some configurations, the processed image data for later reconstruction, display and transmission. An additional interface circuit 64 may be provided for exchanging image data, configuration parameters, and so forth with external system components such as remote access and storage devices 18. Finally, the system control circuit 60 may include various peripheral devices for facilitating operator interface and for producing hard copies of the reconstructed images. In the illustrated embodiment, these peripherals include a printer 66, a monitor 68, and user interface 70 including devices such as a keyboard or a mouse.

While the present approaches will be described in the context of MRI system 10 so as to facilitate discussion, it should be noted that the MRI system 10 is merely intended to be one example, and other system types, such as so-called "open" MRI systems, may also be used. Similarly, such systems may be rated by the strength of their primary magnet, and any suitably rated system capable of carrying out the data acquisition and/or processing described below may be employed. Indeed, the systems described below with respect to FIGS. 2-5 may be applicable to any electrical assembly, or, in the context of MRI, any coil array capable of being switched between resonant states.

Moving now to FIGS. 2-5, embodiments of switching assemblies are illustrated, the switching assemblies being generally configured to switch a resonant loop between a state where the loop is able to resonate with RF energy and a state where the loop is unable to resonate with RF energy. The switching assemblies may be included as a part of a MRI system, or may be provided as part of a kit so as to retrofit an existing coil array for optical control of switching. Moreover, the switching assembly embodiments, while described in the context of receiving coil arrays, are also applicable to any number of coils, such as transmitting coil arrays and so forth.

Figure 2:
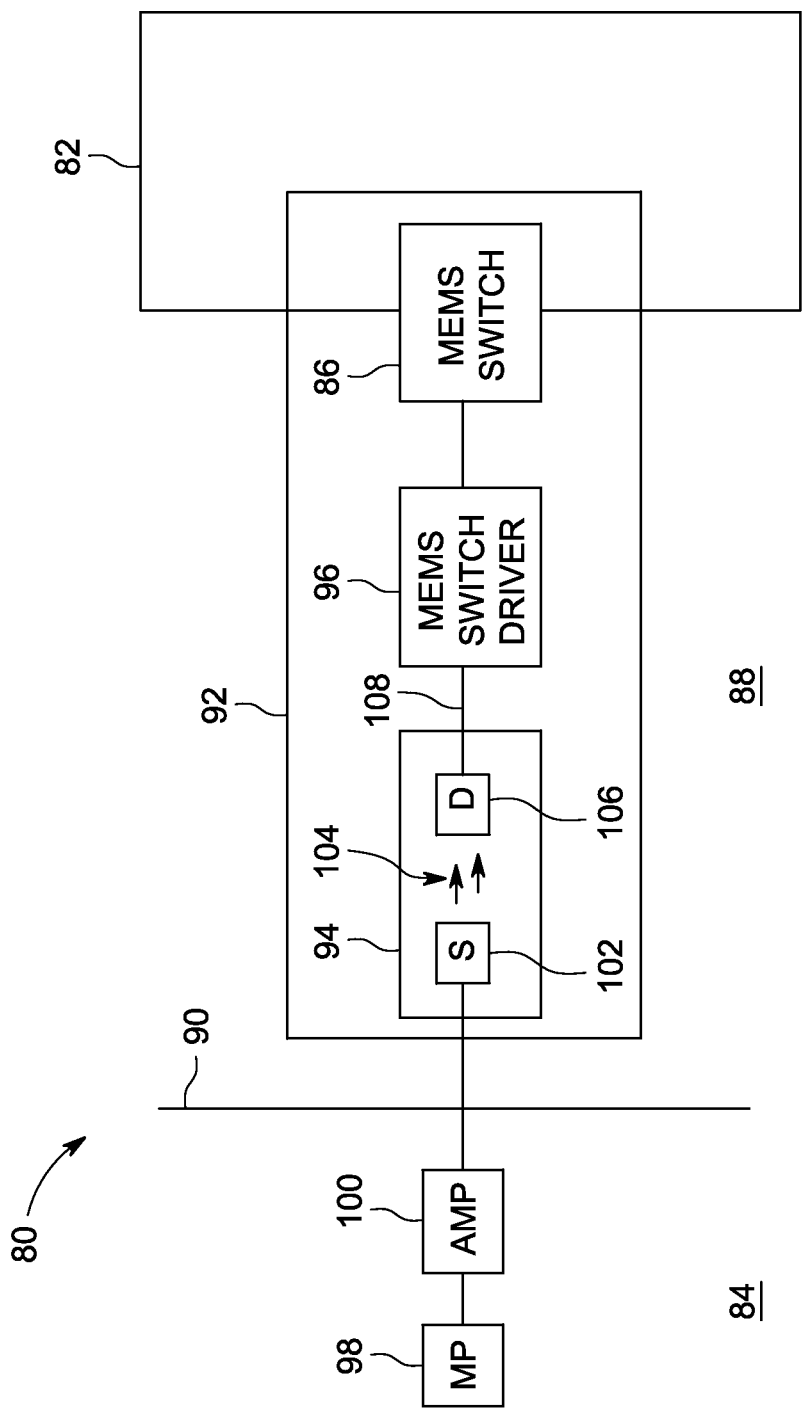
FIG. 2 is a block diagram illustration of a switching assembly in which a surface mount package including a MEMS device, a device driver, and an opto-isolator is configured to receive current-based signals to switch an RF receiving coil between conductive states.
Figure 3:
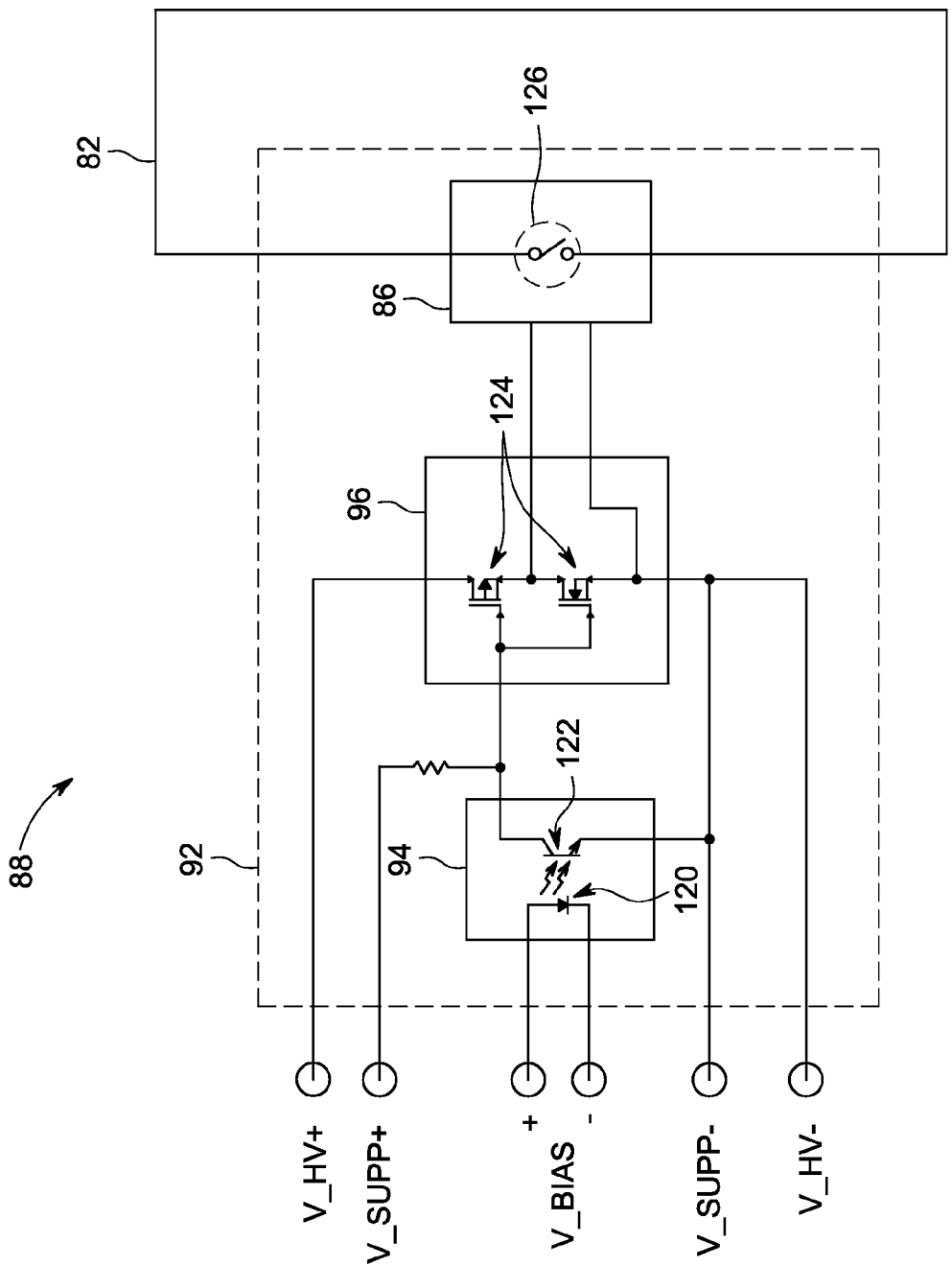
FIG. 3 is a diagrammatical illustration of the surface mount package of FIG. 2.

FIG. 2 illustrates an embodiment of a switching assembly 80 having features for controlling the switching of a resonant loop 82. Generally, in accordance with presently contemplated embodiments, control signals are generated at a system side 84, and the control signals are converted into light, transmitted via an optical medium, and re-converted into an electrical signal for producing switching logic (which causes a MEMS switch 88 to switch the resonant loop 82) at a coil side 88. The division between the system side 84 and the coil side 88 is generally depicted as a line 90. In the embodiment illustrated in FIG. 2, an electrical package 92 (e.g., a surface mount (SMT) or a through hole package) includes features for providing electrical isolation, EM immunity, and switching logic signals. Specifically, the electrical package 92 illustrated in FIG. 2 may be a single package (i.e., a single board) including an opto-isolator 94, a MEMS switch driver 96 in communication with the opto-isolator 94, and the MEMS switch 86 in communication with the MEMS switch driver 96 that is configured to interface with the resonant loop 82. It will be appreciated that the use of a SMT or through hole package may allow facile integration with MRI coil architectures, pick-and-place assembly onto such architectures, and can be readily manufactured based on existing metal oxide semiconductor-field effect transistor (MOSFET) technologies. As an example, the electrical package may have a ball grid array (BGA) configuration, a dual inline package (DIP) configuration, a gull wing configuration, a butterfly configuration, and so on that is capable of interfacing with an electrical assembly. One embodiment of such an electrical package is described in further detail with respect to FIG. 3 below.

As noted above, control signals are generated from the system side 84 of the assembly 80. These control signals are provided to the electrical package 92 as a control input for generating the switching logic for the MEMS switch 86. For example, during operation, the opto-isolator 94 may receive control signals generated from a multiplexer board 98. The multiplexer board 98, in some embodiments, may also receive and multiplex magnetic resonance data received at the loop 82. The control signals produced by the multiplexer board 98 are then routed through a preamplifier 100, and on to the opto-isolator 94. More specifically, the control signals are sent via a current control signal (e.g., via low impedance differential current control signaling) to a light source 102 of the opto-isolator 94. It should be noted that such current signaling may provide enhanced EMI immunity over other signaling techniques, such as voltage-driven signaling. For example, as noted above, EMI may couple onto signaling lines, such as one or more electrical connections between the amplifier 100 and the light source 102. When current-based signaling is not utilized, such as in voltage signaling applications, the EMI may cause the light source 102 to inadvertently activate, which can cause spurious switching logic to be produced and sent to the MEMS switch 86. Thus, in accordance with the present disclosure, the light source 102 is less prone to inadvertent activation by using current signaling rather than voltage signaling. Indeed, in accordance with presently contemplated embodiments, the current control signals may be differential control signals operating at between about 5 milliamps (ma) and 20 ma at a voltage of between about 1 volts (V) and 3 V.

The light source 102 may be a light emitting diode (LED) such as a laser diode or similar light emitting feature that is substantially immune to RF energy. The light source 102 is configured to receive the control signals from the system side 84, which may include various system connectors local to the MRI system 10 described above, as well as various processing and interface circuitry. The light source 102, in response to the received current control signals, produces an optical signal, which is generally depicted as arrows 104. The optical signal 104 can include a single wavelength or multiple wavelengths, and is directed through space across a small distance (e.g., a few microns (μm)) towards an optical transducer, such as a photodetector 106 within the opto-isolator 94. Advantageously, the optical signal 104 is substantially immune to EMI, and in the present context, may include wavelengths in the infrared (IR), near-IR, visible, and/or ultraviolet (UV) portion of the electromagnetic spectrum.

As an example, the photodetector 106 can include a diode array, photomultiplier tube or similar feature configured to produce electrical signals when photons strike the detector 106. The electrical signals that are generated at the photodetector 106 may include high impedance, low power signals that are sent to the MEMS switch driver 96. As an example, the signals may be at a current between about 1 nanoamp (nA) and 5 nA, at a voltage of between about 50 V and 150 V. In some embodiments, which are discussed in further detail below, the proximity of the photodetector 106 to the MEMS switch driver 96 may also result in a reduced probability of EMI coupling with one or more lines 108 connecting the photodetector 106 to the MEMS switch driver 96.

In the illustrated embodiment, the opto-isolator 94 and the MEMS switch driver 96 are each placed onto a printed circuit board (PCB) as part of the electrical package 92. For example, the opto-isolator 94 may be disposed at a distance of about 1 mm to about 20 mm away from the MEMS device driver 96. Such a distance may facilitate communication between the opto-isolator 94 and the MEMS switch driver 96 and allow the electrical package to be of a single piece construction. The MEMS switch driver 96 is generally configured to receive the output from the opto-isolator 94, and condition the received electrical signals into logic appropriate for the MEMS switch 86. For example, the MEMS switch drier 96 may enable high voltage switching logic to the MEMS switch 86, which causes it to switch. In accordance with some embodiments, the MEMS switch 86 can include one or more MEMS assemblies each having respective printed circuit boards, switches, interconnects, and so forth. Generally, the MEMS switch 86 is configured to produce mechanical motion as a result of receiving the switching logic from the MEMS switch driver 96. In the present context, the MEMS switch 86 serves to vary the loop 82 between a coupled and a decoupled state by transitioning between a closed and an open state. As an example, the MEMS switch 86 may transition from an open to a closed state upon receiving the input signals, which causes the loop 82 to switch from a decoupled (non-resonant) state to a coupled (resonant) state. The MEMS switch 86 may interface with the loop 82 using features known in the art, such as via contact pads or similar interfacing standard.

As noted above, FIG. 3 illustrates an embodiment of the electrical package 92 (e.g., a SMT package) wherein the opto-isolator 94, the MEMS switch driver 96, and the MEMS switch 86 are all integrated into a single unit. In the illustrated embodiment, the opto-isolator 94 includes a light emitting diode 120 that produces an optical signal in response to a current induced by a biasing voltage. The optical signal is detected by a diode 122, which produces electrical signals that trigger high voltage MOSFET totem pole drivers 124 within the MEMS switch driver 96. This triggering enables high voltage switching logic to be provided to the MEMS switch 86, causing an electrical junction 126 of the MEMS device to open or close.

Figure 4:
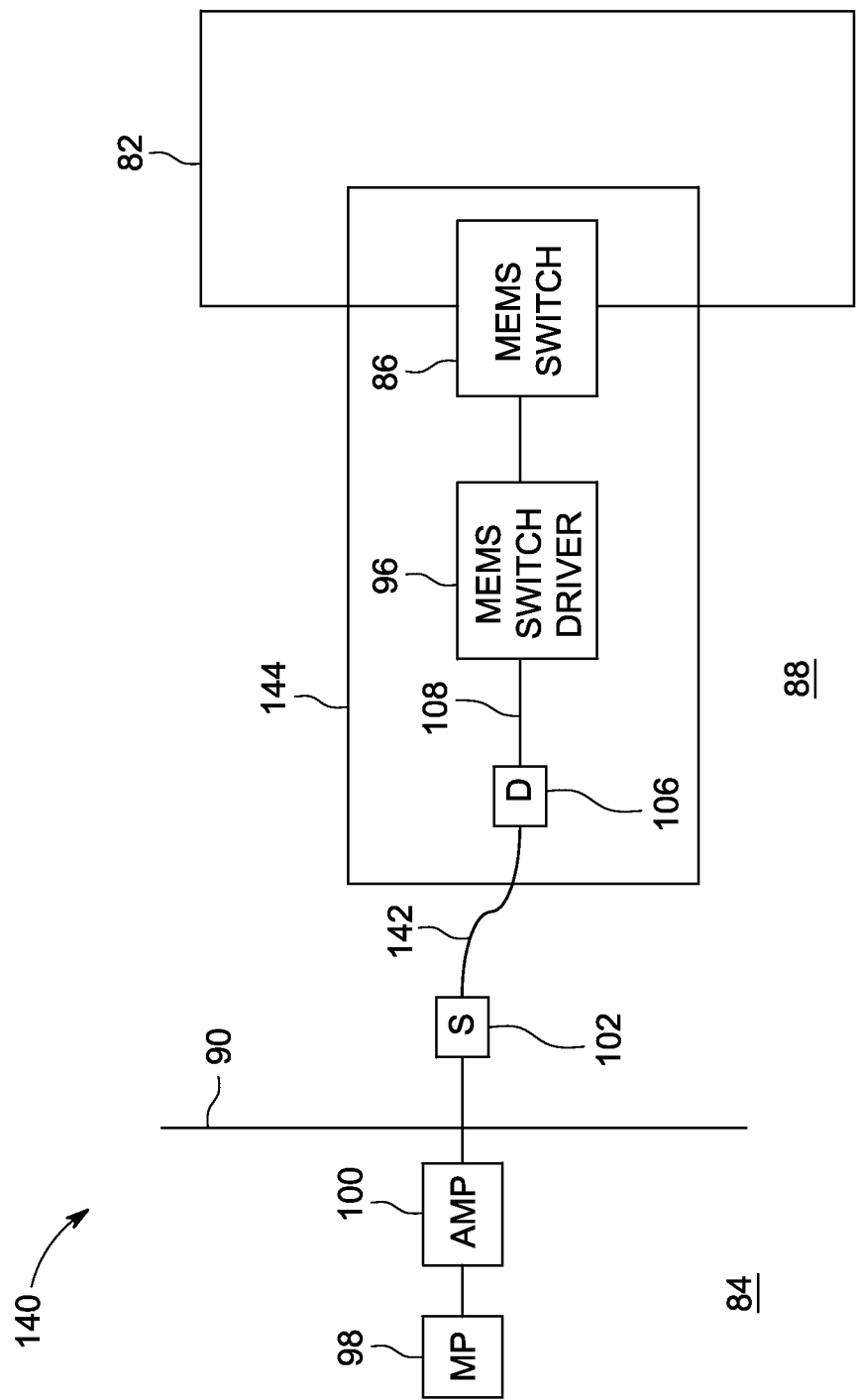
FIG. 4 is a block diagram illustration of a switching assembly in which a light source is in optical communication with a surface mount package having a MEMS device, a device driver, and an optical detector, the light source being disposed on a coil side of the assembly and configured to receive current-based signals to generate an optical signal to switch an RF receiving coil between conductive states.

FIG. 4 illustrates an embodiment of a system 140 similar to that illustrated in FIG. 2, but having the light source 102 coupled to the light detector 106 by way of one or more waveguides 142, such as by one or more optical fibers. Keeping in mind the operation of the system 80, the system 140 includes similar features for switching the resonant loop 82 between resonant states. In accordance with the embodiment illustrated in FIG. 4, such features include the MEMS switch 86, MEMS switch driver 96, and the photodetector 106, all of which are integrated onto a single SMT package 144. It should be noted that while the light source 102 is not part of the SMT package 144, it is disposed on the coil side 88 of the system 140, for example at another area on the resonant loop 82.

In a similar manner to the configuration described with respect to FIG. 2, the light source 102 receives current control signals (e.g., differential current control signals) from one or more features as a part of or local to the system side 84. In system 140, the multiplexer 98 and amplifier 100 provide the current control signals generated by control circuitry to the light source 102. As above, the multiplexer board 98 may generate or otherwise relay one or more control signals to the light source 102 via preamplifier 100. The light source 102 produces a light beam that is transmitted down the optical waveguide 142 and to the photodetector 106. It should be noted that the length of the optical waveguide 142 may be at least partially determined by the length between the light source 102 and the photodetector 106. Keeping in mind that in the illustrated embodiment of FIG. 4 the light source 102 is local to the coil side 88, the optical waveguide 142 may be millimeters, centimeters, decimeters, or meters long. Moreover, in some embodiments, the optical waveguide 142 may interface or otherwise connect to the SMT package 144 using optical communication and/or connection features known in the art. Alternatively, in an embodiment, the optical waveguide 142 may terminate proximal to the photodetector 106.

In embodiments where the photodetector 106 and the light source 102 are separate (i.e., are not part of a single opto-isolator component), it may be desirable to integrate the photodetector 106 to be part of the MEMS switch driver 96. For example, as noted above with respect to FIG. 2, in accordance with some presently contemplated embodiments, the photodetector 106 and the MEMS switch driver 96 may be disposed at a distance from one another that is suitable for preventing EMI coupling to the one or more lines 108 connecting the photodetector 106 to the MEMS switch driver 96. For example, the photodetector 106 may be at a distance from the MEMS switch driver 96 of between about 1 μm and 20 μm, which reduces the probability of the lines 108 coupling with EMI. In such an embodiment, the MEMS switch driver 96 and the photodetector 106 may be part of a monolithic optical gate turn on (optical GTO) device driver.

Figure 5:
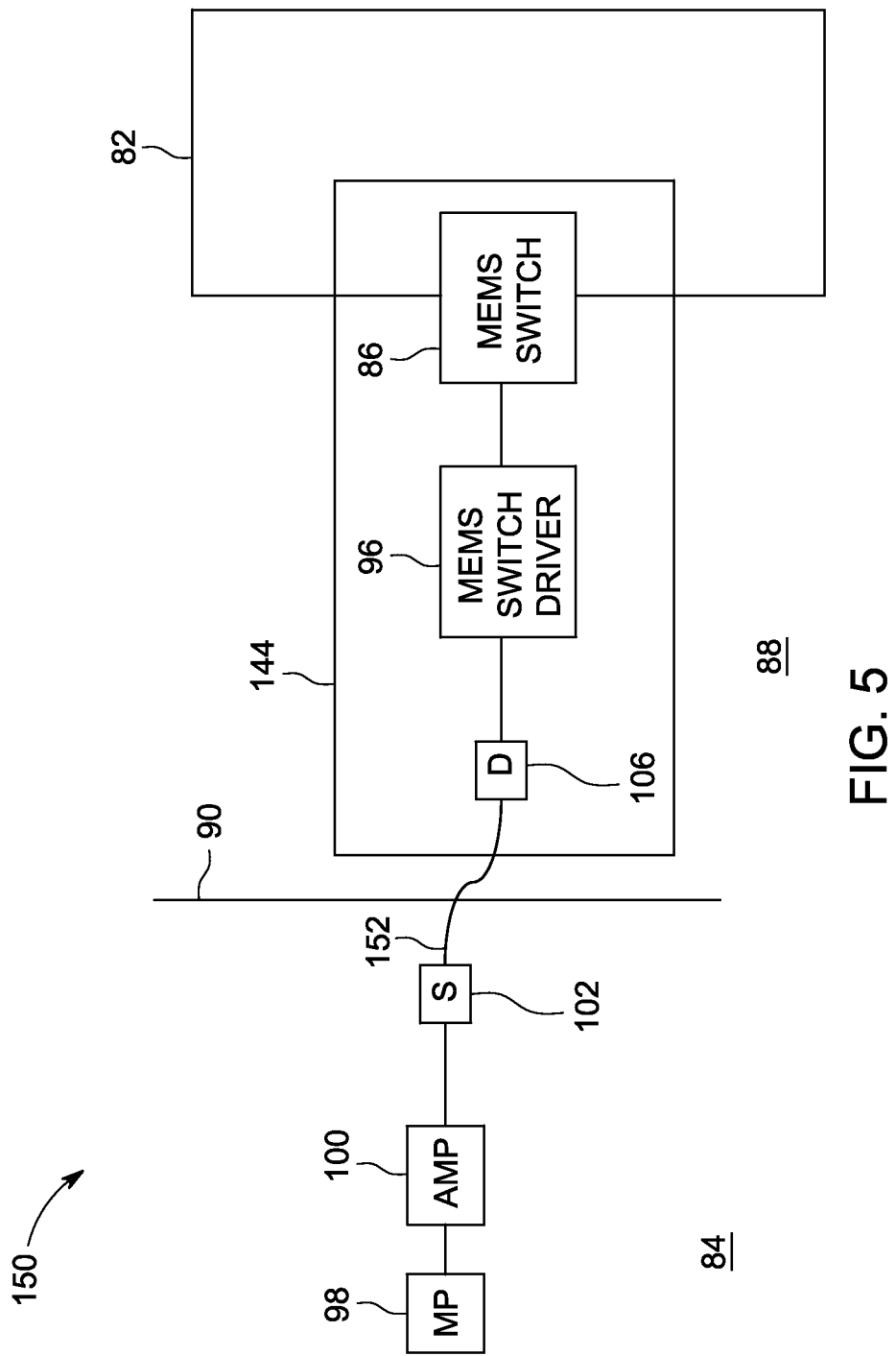
FIG. 5 is a block diagram illustration of a switching assembly in which a light source is in optical communication with a surface mount package having a MEMS device, a device driver, and an optical detector, the light source being disposed on a system side of the assembly and configured to receive current-based signals to generate an optical signal to switch an RF receiving coil between conductive states.

FIG. 5 depicts an embodiment of a system 150 having the light source 102 disposed at the system side 84, rather than the coil side 88. For example, the light source 102 may be disposed local to the MRI system 10, or may be positioned in an adjacent room or in another room in the facility housing the MRI system 10. It will be appreciated that by positioning the light source 102 a distance away from the MRI scanner 12 that is greater than the separation depicted in the embodiments of FIGS. 2-4, larger levels of EMI immunity may be realized. Indeed, in systems where the light source 102 is disposed across a room, in another room, or at another facility, the probability of EMI coupling to the logic connections decreases drastically. Of course, such a configuration may require longer lengths of optical waveguides (e.g., longer optical fibers) than would be required if the light source 102 were disposed proximate or on top of the resonant loop 82. In FIG. 5, the beam of light produced by the light source 102 is transmitted down an optical waveguide 152 having a length from about 0.5 meters up to a kilometer or more. It should therefore be noted that the present embodiments provide the capability for the light source 102 to produce the beam of light at a facility that is separate from the MRI scanner 12 (FIG. 1) by a remote operator.

Figure 6:
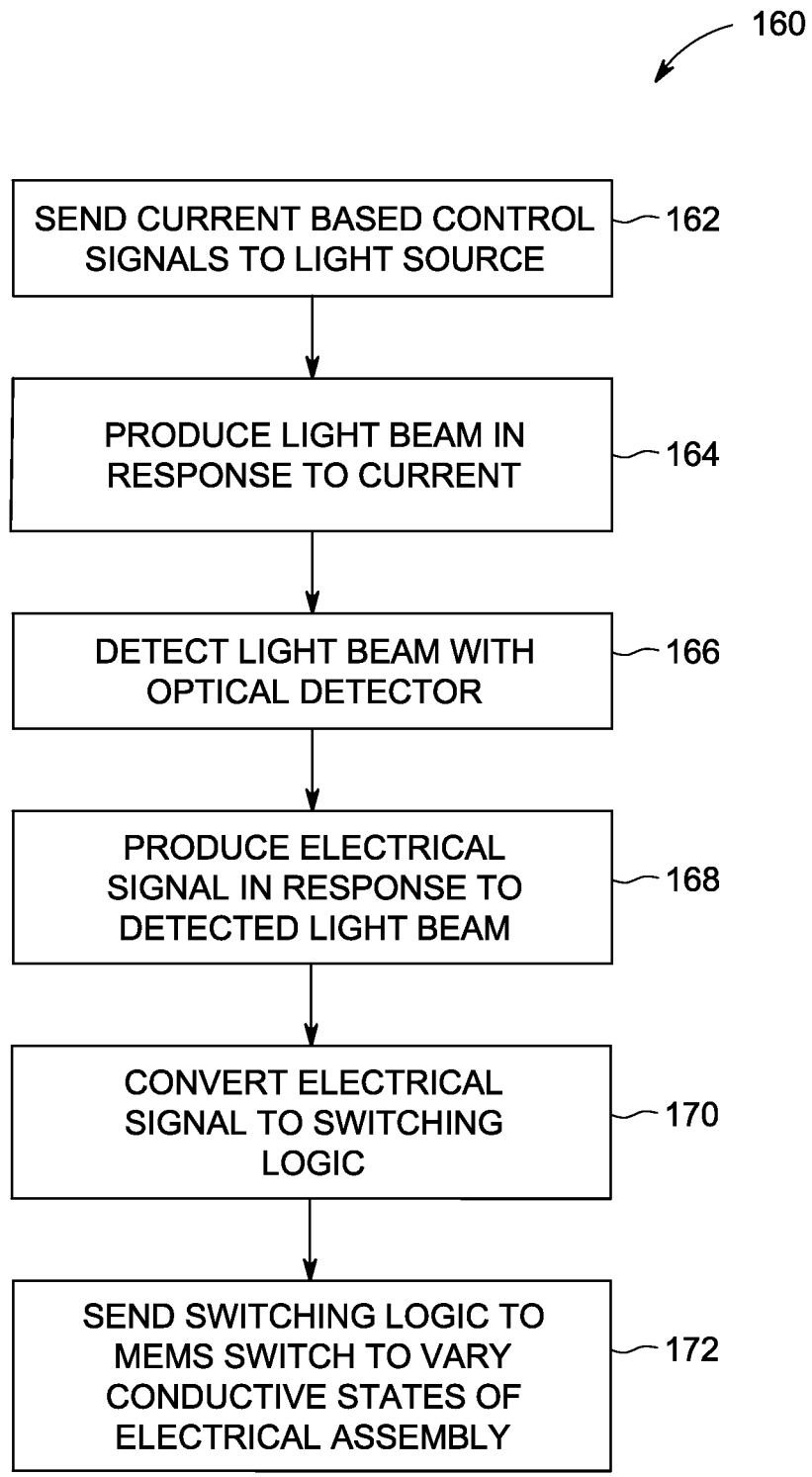
FIG. 6 is a process-flow diagram of a method for switching an electrical assembly between conductive states using an optically controlled MEMS device.

As noted above, the embodiments described herein may be applicable to a number of electrical circuits and/or electrical assemblies. Accordingly, moving now to the process flow diagram illustrated in FIG. 6, the present disclosure also provides an embodiment of a method 160 for optically controlling the switching of an electrical assembly. The method 160 includes sending one or more current-based control signals (e.g., differential current control signals) to a light source, such as an LED or similar feature (block 162). In response to the current, the light source produces a light beam (block 164). The light beam can be transmitted down one or more optical waveguides (e.g., one or more optical fibers), or through any substantially transparent medium such as air, and to an optical transducer, such as a photodetector.

The photodetector detects the light beam (block 166), and produces an electrical signal in response to the detected light beam (block 168). The electrical signal is then sent to a driver, such as a high voltage switch driver (e.g., a high voltage MEMS driver). The high voltage driver then converts the electrical signals into high voltage switching logic (block 170). The logic signal is provided to a MEMS switch or an array of MEMS switches. As a result of receiving the logic signals, the MEMS switches produce mechanical motion to vary conductive states of the electrical assembly to which they are connected (block 172). As an example, the MEMS switches may move from an open to a closed state upon receiving the input signals, which results in the completion of an electrical circuit, such as a resonant loop. When the resonant loop is completed, it may be in a resonant state, as opposed to a non-resonant state when the MEMS switch or switch array is open.

This written description uses examples to disclose the invention, including the best mode, and also to enable any person skilled in the art to practice the invention, including making and using any devices or systems and performing any incorporated methods. It should also be understood that the various examples disclosed herein may have features that can be combined with those of other examples or embodiments disclosed herein. That is, the present examples are presented in such as way as to simplify explanation but may also be combined one with another. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging (MRI) system, comprising:
   a transmitting coil configured to transmit RF energy into a subject of interest;
   a receiving coil capable of being switched between at least a first state, in which the receiving coil can resonate in response to RF signals generated within the subject of interest, and a second state, in which the receiving coil is unable to resonate in response to RF energy produced by the transmitting coil;
   a switch configured to vary the receiving coil between the first and second states in response to a logic signal, wherein the switch comprises a micro electromechanical systems (MEMS) switch;
   a MEMS device driver configured to produce the logic signal in response to an electrical signal;
   an opto-isolator in communication with the MEMS device driver and configured to produce the electrical signal from an optical signal produced by a light source in response to a current-based control signal, such that the light source produces a light beam which is transmitted to a photodetector;
   wherein the MEMS device driver is connected to the photodetector and in communication with the MEMS switch to produce high voltage switching logic from the electrical signal.

2. The system of claim 1, wherein the MEMS device driver is positioned in proximity to the photodetector, which results in a reduced probability of electromagnetic interference (EMI) coupling with the connection between the MEMS device driver and the photodetector.

3. The system of claim 1, wherein the MEMS switch is configured to reversibly create a disconnect in the resonant loop to vary the receiving coil between the first state and the second state.

4. The system of claim 1, wherein the current-based control signal provided to opto-isolator has a current of between about 5 milliamps (ma) and 20 ma.

5. The system of claim 1, wherein the MEMS device driver and the opto-isolator are disposed between about 1 mm and 20 mm from each other.

6. The system of claim 1, wherein the opto-isolator comprises the light source and the photodetector, and the photodetector is in communication with the device driver, the photodetector being operable to produce the electrical signal at between about 1 nanoamp (nA) and 5 nA of current at a voltage of between about 50 volts (V) and 150 V.

7. The system of claim 1, wherein opto-isolator, the MEMS device driver, and the MEMS switch are integrated into an electrical package that is configured to interface with the receiving coil.

8. The system of claim 1, wherein the MEMS device driver comprises metal oxide semiconductor field effect transistor (MOSFET) totem pole drivers configured to produce the logic signal.

9. The system of claim 8, comprising control circuitry configured to send the current-based control signal to the opto-isolator to cause the MEMS switch to vary the receiving coil from the first state to the second state when the transmitting coil is transmitting RF energy, and to vary the receiving coil from the second state to the first state when the transmitting coil is not transmitting RF energy.

\* \* \* \* \*

UNITED STATES PATENT AND TRADEMARK OFFICE
CERTIFICATE OF CORRECTION

| | | Page 1 of 1 |
|---|---|---|
| PATENT NO. | : 8,749,237 B2 | |
| APPLICATION NO. | : 13/004757 | |
| DATED | : June 10, 2014 | |
| INVENTOR(S) | : Iannotti et al. | |

It is certified that error appears in the above-identified patent and that said Letters Patent is hereby corrected as shown below:

In the Drawings

In Fig. 1, Sheet 1 of 6, for Tag "46", in Line 2, delete "CONTROLED" and insert -- CONTROLLED --, therefor.

In the Specification

In Column 1, Line 36, delete "processing" and insert -- precessing --, therefor.

In Column 6, Line 29, delete "switch 88" and insert -- switch 86 --, therefor.

In Column 7, Line 56, delete "drier" and insert -- driver --, therefor.

Signed and Sealed this
Second Day of December, 2014

Michelle K. Lee
*Deputy Director of the United States Patent and Trademark Office*